United States Patent
Stroet

(10) Patent No.: US 9,391,577 B2
(45) Date of Patent: Jul. 12, 2016

(54) LOW-VOLTAGE ANALOG VARIABLE GAIN AMPLIFIER WITH ENHANCED LINEARITY

(71) Applicant: Linear Technology Corporation, Milpitas, CA (US)

(72) Inventor: Petrus M. Stroet, Santa Cruz, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/670,031

(22) Filed: Mar. 26, 2015

(65) Prior Publication Data

US 2015/0326198 A1    Nov. 12, 2015

Related U.S. Application Data

(60) Provisional application No. 61/989,908, filed on May 7, 2014.

(51) Int. Cl.
| | |
|---|---|
| *H03F 3/45* | (2006.01) |
| *H03G 3/00* | (2006.01) |
| *H03G 3/30* | (2006.01) |
| *H03F 1/02* | (2006.01) |
| *H03F 3/19* | (2006.01) |
| *H04L 27/34* | (2006.01) |

(Continued)

(52) U.S. Cl.
CPC ........... *H03G 3/3042* (2013.01); *H03F 1/0205* (2013.01); *H03F 1/32* (2013.01); *H03F 3/19* (2013.01); *H03F 3/45098* (2013.01); *H03G 1/0023* (2013.01); *H03G 1/0029* (2013.01); *H04L 27/34* (2013.01); *H03F 2200/336* (2013.01); *H03F 2200/451* (2013.01)

(58) Field of Classification Search
CPC .................................. H03F 3/45; H03G 3/00
USPC .......................................... 330/254, 278, 300
See application file for complete search history.

(56) References Cited

U.S. PATENT DOCUMENTS

| | | | | |
|---|---|---|---|---|
| 4,081,609 A | * | 3/1978 | Beene ................... | H04M 19/04 370/485 |
| 4,495,470 A | * | 1/1985 | Bristol .................... | H03F 1/304 330/51 |

(Continued)

OTHER PUBLICATIONS

EP Application No. 15001197.1 "Extended European Search Report", 14 pages.

(Continued)

*Primary Examiner* — Patricia Nguyen
(74) *Attorney, Agent, or Firm* — Patent Law Group LLP; Brian D. Ogonowsky

(57) ABSTRACT

In a variable gain amplifier, a base of a bipolar first transistor receives a first differential input signal. The emitter of the first transistor is connected in series between a first resistor and a MOSFET coupled to ground. An output of the amplifier is a current through the collector. The conductivity of the MOSFET controls a gain of the amplifier. A bipolar second transistor receives a second differential input signal, and the second transistor provides a modulated gate voltage to the MOSFET. The drain voltage of the MOSFET is modulated by the first differential input signal and thus undesirably generates distortion. To reduce the distortion, the modulated gate voltage causes the AC component for a certain DC voltage at the drain of the MOSFET to be lowered, improving linearity. Since no current source is used, the amplifier has a large headroom, allowing operation using a low operating voltage.

17 Claims, 7 Drawing Sheets

(51) Int. Cl.
*H03F 1/32* (2006.01)
*H03G 1/00* (2006.01)

(56) References Cited

U.S. PATENT DOCUMENTS

| | | | |
|---|---|---|---|
| 5,724,519 A * | 3/1998 | Kato | H03F 1/34 345/10 |
| 5,999,050 A | 12/1999 | Baltus | |
| 7,741,909 B2 | 6/2010 | Tong et al. | |
| 7,889,006 B1 | 2/2011 | Jones | |
| 2001/0001232 A1 | 5/2001 | Kung | |
| 2001/0026192 A1 | 10/2001 | Yamamoto | |
| 2006/0001491 A1 | 1/2006 | Barou et al. | |
| 2010/0315166 A1 * | 12/2010 | Kamimura | H03F 3/72 330/285 |

OTHER PUBLICATIONS

Naktongkul, "A 1-V 25-db 100 Mhz CMOS variable gain amplifier cell", Communications and Information Technology 2004. ISCIT 2004. IEEE International Symposium on Sapporo, Japan. Oct. 26-29, 2004. Piscataway, NJ, USA, IEEE, vol. 1, Oct. 26, 2004, pp. 527-530.

* cited by examiner

LOW-VOLTAGE ANALOG VARIABLE GAIN AMPLIFIER WITH ENHANCED LINEARITY

CROSS REFERENCE TO RELATED APPLICATIONS

This application claims priority from U.S. provisional application Ser. No. 61/989,908, by Petrus M. Stroet, filed May 7, 2014, incorporated by reference.

FIELD OF INVENTION

The present invention relates to analog, continuous controllable gain amplifier (in contrast to a digitally programmable gain amplifier) and, in particular, to such an amplifier with improved headroom. We will refer to it as a Variable Gain Amplifier (VGA).

BACKGROUND AND RELATED ART

In some RF transmission systems, it is desirable to use a VGA. For example, the gain may be varied for varying output power or used for gradual power ramping to limit signal energy spill-over in neighboring channels. FIG. 1 shows one type of conventional variable gain amplifier 10.

U.S. Pat. No. 7,889,006 to Jones ("Jones") discloses a VGA as drawn in FIG. 1. In FIG. 1, differential input signals Vin+ and Vin- are applied to the transistors Q1 and Q2. Fixed current sources I_DC1 and I_DC2 couple the emitters of the transistors Q1 and Q2 to ground. A resistor R1 is coupled across the emitters to set a minimum gain of the amplifier. In parallel with resistor R1 are resistor R2, a MOSFET M1, and a resistor R3. When MOSFET M1 is off, the minimum gain is achieved. Progressively turning on MOSFET M1 increases the gain to a maximum. A $V_{CTRL}$ signal is converted to a proper level by a gate voltage control circuit 12.

The currents through the transistors Q1 and Q2 cause voltage drops across the resistors R4 and R5, and the output of the amplifier may be the differential voltages Vout- and Vout+.

One drawback of amplifier 10 is that it has a limited headroom. In this context, the term headroom is the difference between the minimum input voltage Vin level needed for proper operation and Vcc (the operating voltage). Specifically, a problem with the circuit of FIG. 1 is that Vin cannot go below the level needed for the current sources to supply the target current.

FIG. 2 illustrates a very simple example of the current source I_DC1 or I_DC2 in FIG. 1. A fixed bias voltage Vbias is coupled to the base of the bipolar transistor 14, and a degeneration resistor 16 is provided for improving the noise performance of the current source. In a typical amplifier 10, the voltage drop across the resistor 16 may be 100 mV. For linear operation of the transistor 14, the collector-emitter voltage Vce may be a minimum of 0.4 volt. Therefore, the collector voltage must be at least 0.5 volt. Referring back to FIG. 1, the minimum level of Vin+ or Vin- must then be at least 1.2 volts, assuming a Vbe of the transistors Q1 and Q2 of 0.7 volt. Vcc must be high enough so that the Vce of the transistors Q1 and Q2 is sufficiently high for linear operation even with the highest currents across the transistors Q1 and Q2. As seen, due to the minimum operating requirements of the current sources I_DC1 and I_DC2, the minimum Vcc necessary to properly operate the amplifier 10 is limited.

Further, since the Vin+ and Vin- signals are generated by an upstream circuit, such as a digital-to-analog converter (DAC), the relatively high required minimum Vin+ and Vin- signals lower the headroom for those other circuits.

It is desirable to operate battery powered transmitters at lower and lower voltages. Therefore, what is needed is a highly linear VGA that enables an input voltage to be lower than the minimum input voltage of the circuit of FIG. 1. This will increase the headroom of the amplifier and the headroom of circuits that supply input signals to the amplifier. Thus, the transmitter system can be operated with a lower operating voltage Vcc.

SUMMARY

A variable gain amplifier is disclosed that does not use an active current source between an input transistor and ground. Therefore, there is no current source that raises the required minimum input voltage level. As a result, headroom is increased, allowing the use of a lower minimum operating voltage Vcc.

In one embodiment, a VGA has differential (or complementary) inputs for receiving signals Vin+ and Vin-. Vin- is applied to the base of a bipolar first transistor whose emitter is coupled to ground via a first resistor and a MOSFET. The collector of the first transistor presents a current that may be used for any purpose, such as for modulating a carrier wave for RF transmission, or creating a voltage drop across an output resistor to generate an output voltage for any use. The conductivity of the MOSFET controls the trans-conductance gain of the first transistor.

A bias voltage is externally supplied for setting a suitable gate bias range for the MOSFET. The Vin+ signal is applied to a bipolar second transistor, and the conductivity of the second transistor modulates the bias voltage applied to the MOSFET's gate. An increase in the Vin+ signal (while the Vin- signal decreases) lowers the gate voltage, which affects the conductivity of the MOSFET.

The drain voltage of the MOSFET is modulated by the Vin- signal and thus undesirably generates distortion. To reduce the distortion, the modulated gate voltage causes the AC component for a certain DC voltage at the drain of the MOSFET to be lowered, improving linearity. In other words, for a corresponding AC voltage swing ($V_{DS}$, AC, which corresponds to a certain gain setting), the DC drain-source voltage ($V_{DS}$, DC) is higher, resulting in improved linearity.

The combined voltage drop across the first resistor and MOSFET can be made much lower than the required voltage drop across the current source I_DC1 of FIG. 1 so that the emitter voltage of the first transistor can be much lower. This results in increased headroom between Vin- and Vcc, allowing Vcc to be lower than the Vcc in FIG. 1, while still achieving optimal operation of the amplifier. Allowing the minimum input signal Vin- to be lower also improves the headroom of the upstream circuits that generate Vin-.

Another advantage of the VGA is that the current consumption is lowered by the deletion of the two current sources, in case the gain setting is smaller than OdB.

A third advantage of the VGA is that it has better overall linearity due to the reduction of distortion by using a fraction of the input AC signal swing on the gate of the MOSFET.

The single-ended amplifier may be made differential by interconnecting two of the amplifiers and reversing their input signals.

The invention is particularly useful as an amplifier or mixer in an RF transmitter where digital signals are converted to an analog modulation signal for a carrier wave, such as in a QAM system.

Various other embodiments are described that include a digital on-off circuit and a digital gain control for operation within various discrete gain ranges.

BRIEF DESCRIPTION OF THE DRAWINGS

Elements in the various figures that are the same or equivalent are labeled with the same numeral.

DETAILED DESCRIPTION

Figure 1:
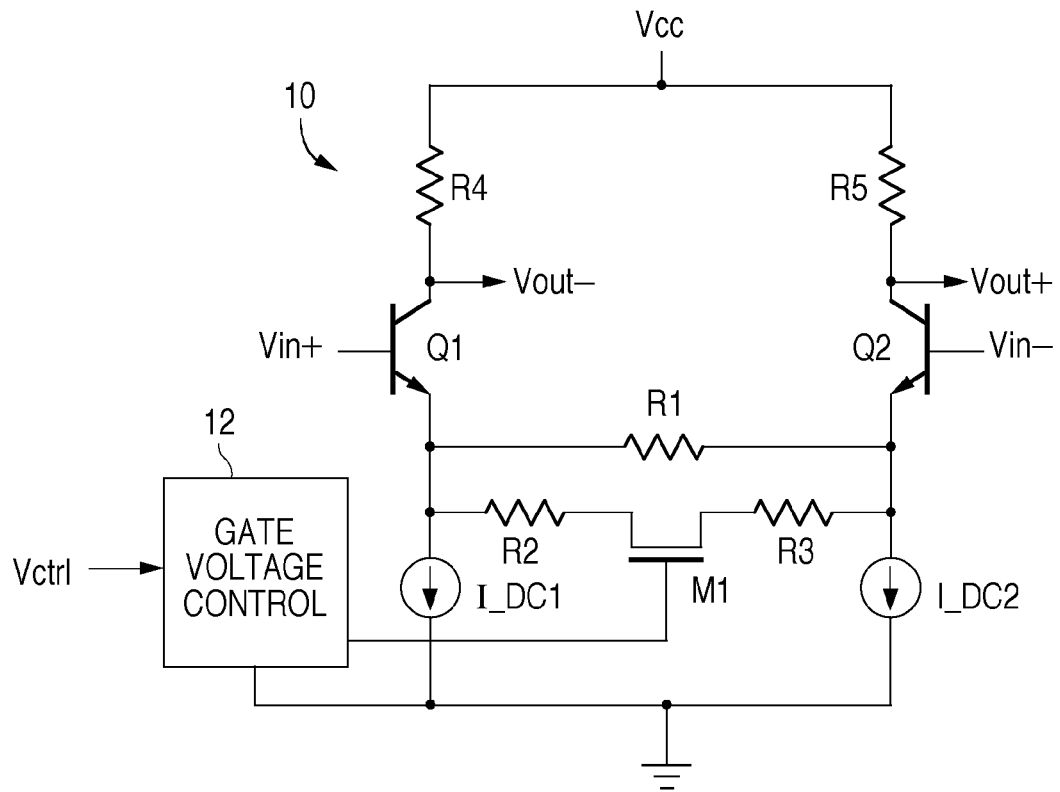
FIG. 1 illustrates a prior art VGA ("Jones") having relatively poor headroom due to current sources between the input transistors and ground.
Figure 2:
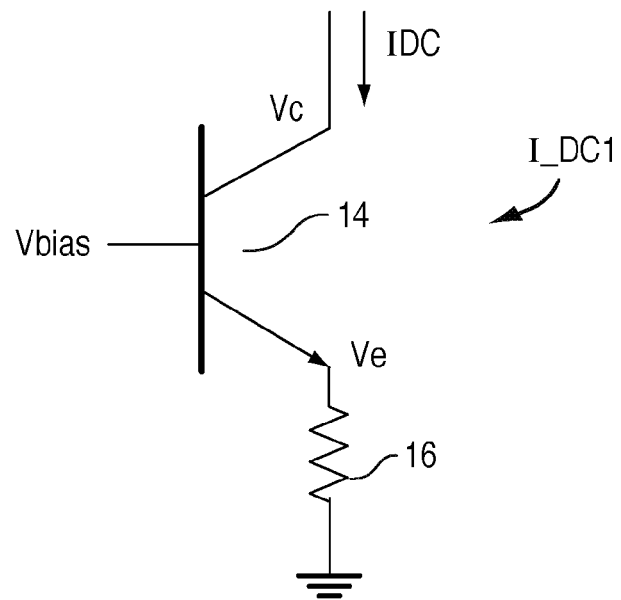
FIG. 2 illustrates a simplified current source used in the circuit of FIG. 1.
Figure 3A:
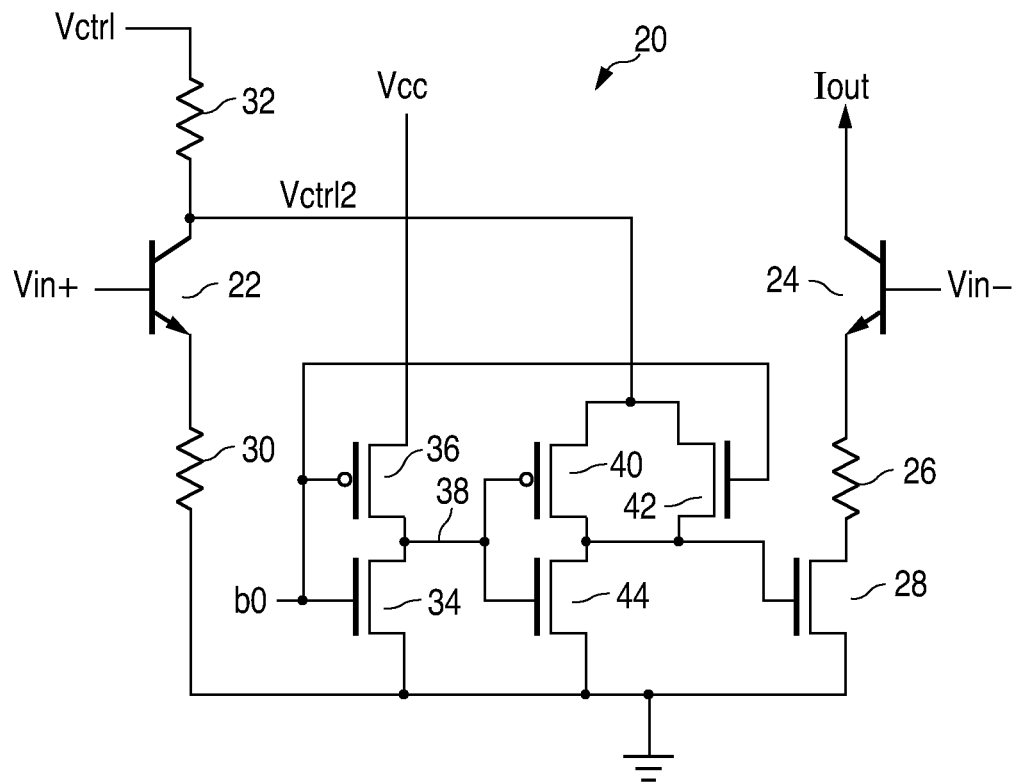
FIG. 3A illustrates a VGA, in accordance with a first embodiment of the invention, which does not use a current source between the input transistor and ground and which has dynamic gain control for improving linearity via a compensation transistor.

FIG. 3A illustrates a first embodiment of a VGA 20 with increased headroom compared to the amplifier of FIG. 1 and with dynamic gain control for improving linearity.

Differential analog signals Vin+ and Vin− are applied to the bases of transistors 22 and 24, respectively. The emitter of the transistor 24 is coupled to ground via a resistor 26 and an N-channel MOSFET 28. The output of the amplifier 20 is a variable current Iout through the collector of the transistor 24. Depending on the application, the collector current may be directly coupled to the next stage, such as a mixer in a QAM modulator for a transmitter, or a resistor may be connected between the collector and Vcc, like in FIG. 1, where the resulting voltage at the collector provides an output voltage to the next stage.

The conductivity of the MOSFET 28 controls the gain of the amplifier 20.

The transistor 22 has its emitter coupled to ground via a resistor 30 and its collector coupled to a gain control signal $V_{CTRL}$ via a resistor 32. $V_{CTRL}$ is a bias voltage that may be constant or varied by an external circuit and provides a bias voltage for the gate of the MOSFET 28. It is assumed that the signal $V_{CTRL}$ is constant during operation.

The node between the resistor 32 and the collector of the transistor 22 provides a modulated control voltage $V_{CTRL}2$ to the gate of the MOSFET 28 via a digital on-off switch. The current through the transistor 22, controlled by the Vin+ signal, and the voltage drop across the resistor 32 are proportional to Vin−, such that the voltage applied to the gate of the MOSFET 28 can be considered to be a combined bias voltage and a signal proportional to Vin−. The proportionality depends on the gain of the transistor 22 and the value of the resistor 32.

The digital signal b0 enables the amplifier 20 when high and disables the amplifier 20 when low. When b0 is high, the N-channel MOSFET 34 is on and the P-channel MOSFET 36 is off. Therefore, the node 38 will be low. A pass gate is formed by parallel P-channel and N-channel MOSFETs 40 and 42, respectively. When b0 is high, the low voltage at the node 38 turns the MOSFET 44 off and turns the MOSFET 40 on. The MOSFET 42 is also on by the high b0 signal. Since the $V_{CTRL}2$ signal is coupled to the conductive pass gate, the pass gate couples the $V_{CTRL}2$ signal directly to the gate of the MOSFET 28 to modulate the conductivity of the MOSFET 28.

When Vin− goes down and Vin+ goes up, the transistor 22 draws more current and $V_{CTRL}2$ lowers. This lowers the MOSFET 28 gate voltage. At the same time, the lowered Vin− signal decreases the MOSFET's 28 drain voltage since R26 and MOSFET 28 form a voltage divider. At very low currents, the drain voltage of the MOSFET 28 may be about 0.6 volt. As the current through transistor 24 increases, the drain voltage is lowered.

In one embodiment, the variable gain, by controlling $V_{CTRL}$, has a maximum range of about 70 dB.

If a resistor is coupled between the collector of the transistor 24 and Vcc, similar to the resistor R5 in FIG. 1, the output of the amplifier 20 will be an output voltage at the collector of the transistor 24.

In one embodiment, the output of the amplifier 20 amplifies a signal to be transmitted, and the signal is mixed with a local oscillator signal or an RF signal for transmission.

If b0 is low, both MOSFETs 40 and 42 in the pass gate are off. MOSFET 44 is on, connecting the gate of MOSFET 28 to ground and disabling the amplifier 20.

By obviating the need for the current sources I_DC1 and I_DC2 in FIG. 1, the minimum level of the input voltage Vin− may be, for example, 0.7 volt or less, as compared with the minimum input voltage of 1.2 volt in FIG. 1. Thus, the amplifier 20 may be operated with a lower operating voltage Vcc.

A simple model for MOSFET 28 is given by:

$$I_D = \frac{W}{L}\mu C'_{OX}\left[(V_{GS} - V_T)V_{DS} - \frac{1}{2}V_{DS}^2\right] \quad (1)$$

with $I_D$ being the drain current, $V_{GS}$ the gate-source voltage, $V_T$ the threshold voltage, $V_{DS}$ the drain-source voltage, W the width of the MOSFET, L the length of the MOSFET, μ the electron mobility and $C'_{ox}$ the gate capacitance per unit area. Equation (1) is valid for $V_{GS} > V_{DS} + V_T$, the so-called "triode" region. Equation (1) predicts second-order distortion because of the $V_{DS}^2$ term. In a balanced configuration, the even-order contributions will largely cancel and no other distortion products will be present according to Equation (1).

However, in a real MOSFET device there is a significant third-order distortion that is not predicted by Equation (1). A semi-charge sheet model discussed by Groenewold predicts third-order distortion due to the field-dependent mobility reduction effect. This can be calculated by:

$$I_D = \frac{W}{L} \int_{V_{sb}}^{V_{db}} \mu_{tot}(E_{eff}) |Q'_i(V_{cb})| dV_{cb} \tag{2}$$

It seems the insight from Equation (2) is not much more than using the MOSFET models themselves as a basis to explain the third-order distortion effects.

MOSFET 28 is controlling the variable gain aspect of FIG. 3. The equivalent output resistance of MOSFET 28 seen at the drain is not only determined by the current increase caused by a drain-source voltage increase ($dI_D/dV_{DS}$) but now also by a current increase caused by an increasing gate-source voltage ($dI_D/dV_{GS}$). $V_{CTRL}$ sets the gate-source DC bias point ($V_{GS, DC}$) and as a result shifts the drain-source bias point ($V_{DS, DC}$) also. This shifts the contribution the gate-source AC voltage swing and the drain-source AC voltage swing have on the dynamic resistance at the drain.

For maximum gain ($V_{CTRL}$ is high, 0 dB gain) the trans-conductance from the gate ($dI_D/dV_{GS}$) is low compared to the trans-conductance from the drain ($dI_D/dV_{DS}$). For much lower gain settings (say −10 dB gain), the opposite happens. In between, both contributions can be equal (which happens for gain setting of about −2 dB in our implementation).

All components of the converter may be formed in a single integrated circuit.

Figure 3B:
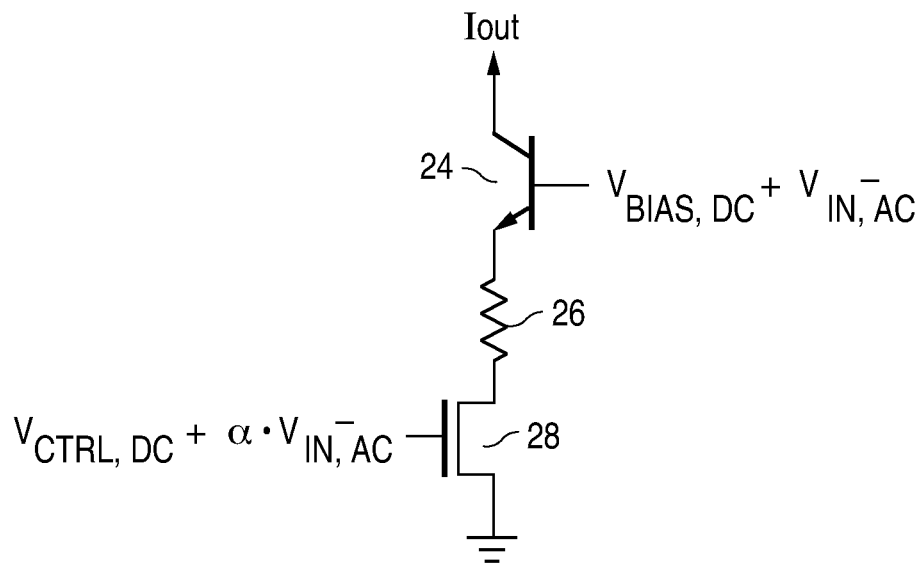
FIG. 3B illustrates the output portion of the VGA of FIG. 3A with the control signals identified.

FIG. 3B illustrates the output portion of the VGA of FIG. 3A with the control signals identified. As seen the control input into the gate of the MOSFET 28 can be considered to be the DC $V_{CTRL}$ signal modulated by a signal proportional to Vin−. The base voltage into the transistor 24 is a DC bias voltage $V_{BIAS}$, $D_C$ (for establishing an operating point) plus the Vin− signal. Vin− is assumed to be an AC signal. The transistor 22 in FIG. 3A also has a DC bias voltage for establishing its operating point, typically equal to that of transistor 24. In the application $V_{BIAS}$, $D_C = 1.4V$ is used.

Figure 4:
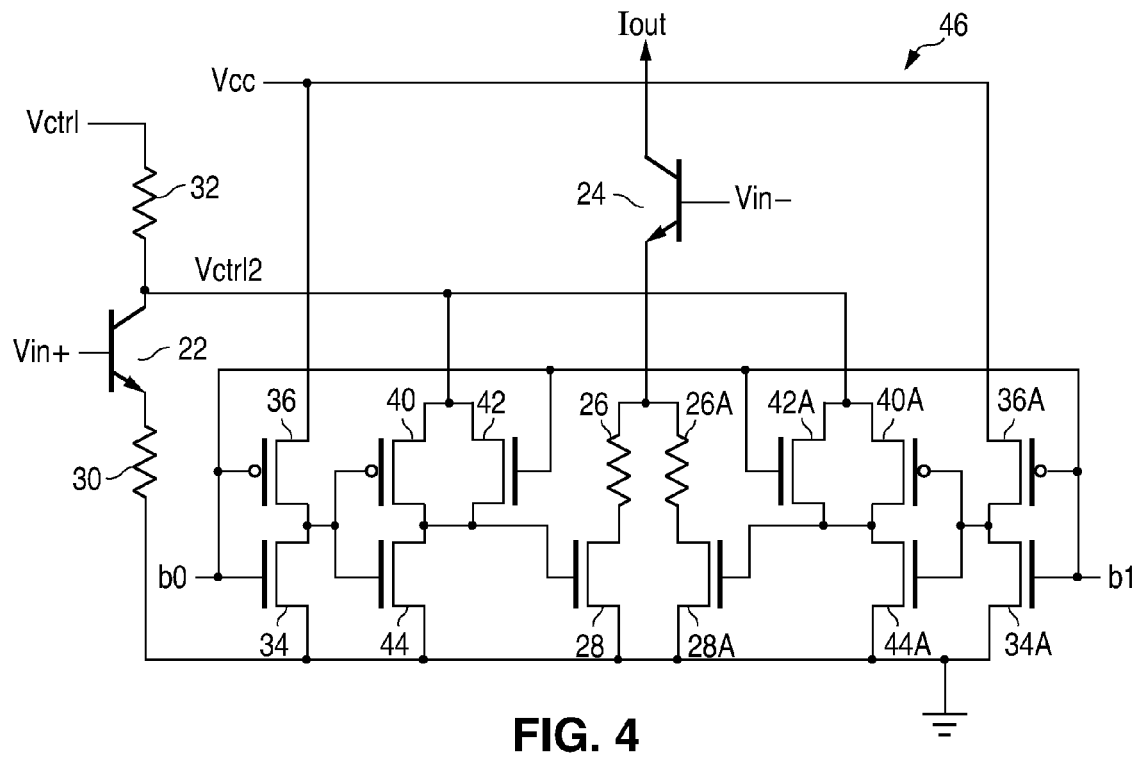
FIG. 4 illustrates a VGA, in accordance with a second embodiment of the invention, having digital gain control, where the gain is further modulated by the Vin+ signal to improve linearity.

FIG. 4 illustrates the amplifier 20 of FIG. 3 but with the gain being further controlled by the digital signals b0 and b1. In one embodiment, the value of the resistor 26A is twice that of resistor 26, and the MOSFET 28 is twice as wide as the MOSFET 28A. The other components 34A, 36A, 40A, 42A, and 44A in the digital switch may be identical to the components 34, 36, 40, 42, and 44.

Four coarse gain settings can be made using the control signals b0 and b1. When b0 and b1 are both low, the amplifier is disabled. When only b0 is high, the amplifier operation is identical to that of FIG. 3. When only b1 is high, the amplifier operation is identical to that of FIG. 3, but employing the values of the resistor 26A and MOSFET 28A, resulting in only half the gain. When both b0 and b1 are high, the resistors 26 and 26A and the MOSFETs 28 and 28A are in parallel to reduce the effective degenerative resistance, to increasing the gain of the amplifier to 1.5×. The four gain settings produce a maximum trans-conductance gain of 0, 1/resistor 26, 1/resistor 26A, and 1/resistor 26 in parallel with resistor 26A. The MOSFET 28 and 28A conductivities are controlled by $V_{CTRL}2$, which are modulated by the Vin+ signal, as previously described, to improve the linearity. The effects of the MOSFETs 28 and 28A lower the maximum gains set by the signals b0 and b1 down to a value that can be 70 dB lower.

Many More Digital Stages can be Used to Add More Gain Levels or Resolution

Figure 5:
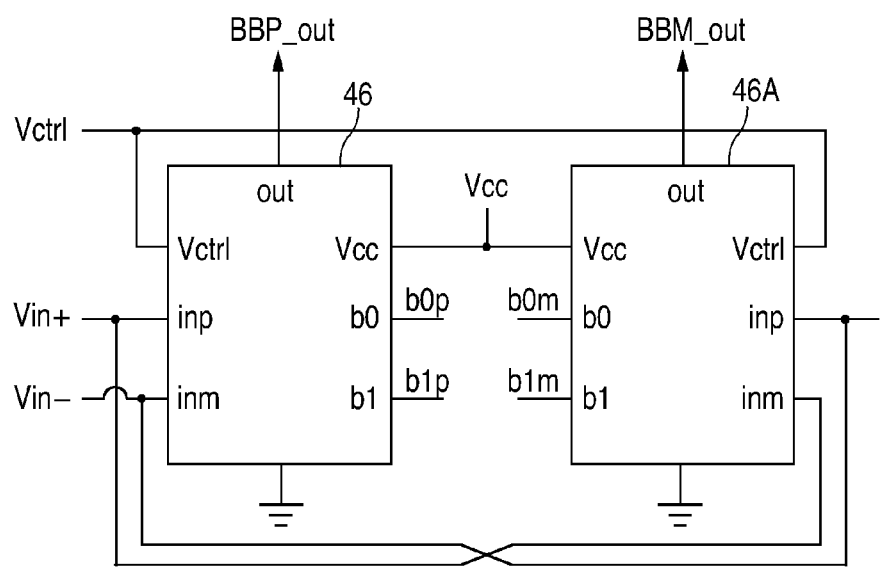
FIG. 5 illustrates how two of the single-ended output amplifiers of FIG. 4 can be interconnected to generate a differential output.

The amplifier 46 of FIG. 4 has a single-ended output Tout. If a differential output is desired, the configuration of FIG. 5 may be used, where two identical amplifiers 46 and 46A are used and the inputs to the amplifiers 46 and 46A are reversed. Identical b0 and b1 signals are applied to the terminals of both amplifiers 46 and 46A. In FIG. 5, it is assumed that the outputs are differential baseband outputs BBP_out and BBM_out for a transmitter. These signals may then be applied to a differential mixer for modulating an LO carrier wave with the baseband signal. The baseband signal may represent a voice signal, a digital code, or any other signal for RF transmission. Any AC currents in the $V_{CTRL}$ signal will be opposite in phase for the two amplifiers and will cancel out, and only a DC current remains.

Figure 6:
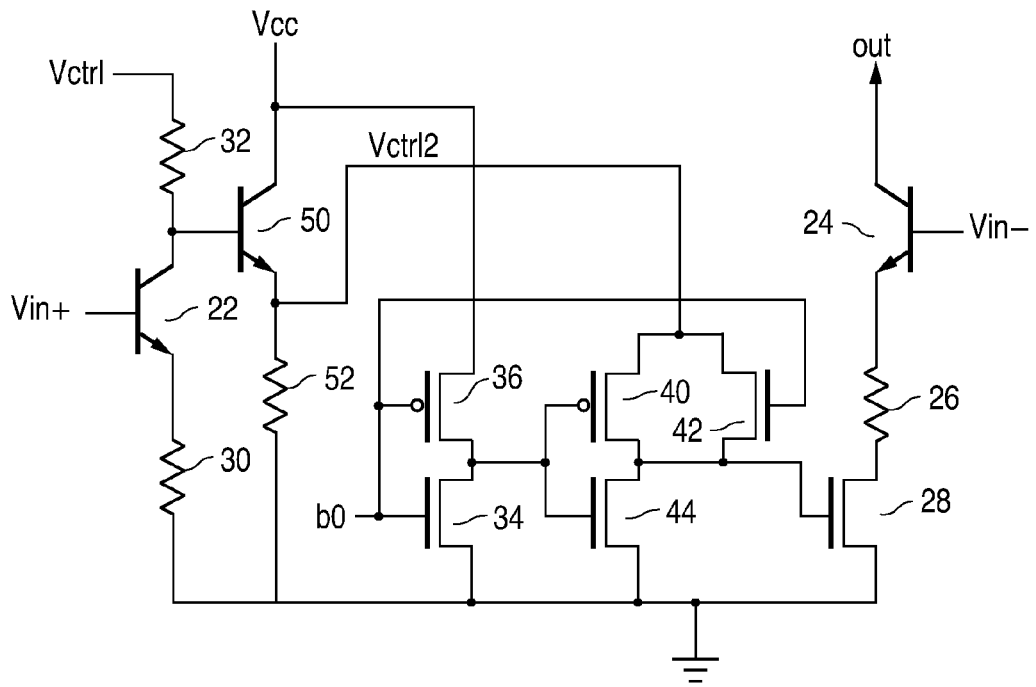
FIG. 6 illustrates the amplifier of FIG. 3 but with a level shifter for the MOSFET gate voltage, thus increasing Vice for the transistor 22. This allows lower MOSFET 28 gate voltages for more VGA range.

FIG. 6 is identical to FIG. 3A except a level shifter, formed by transistor 50 and resistor 52, level shifts the $V_{CTRL}2$ signal downward by about 0.7 volt to prevent transistor 22 going into saturation in case MOSFET 28 is set to a low gate voltage. Additional level shifting circuits may also be used to adjust the range of the gate voltage. Resistor 52 may have a series MOSFET to disable the current in transistor 50 when the circuit is switched off.

Figure 7:
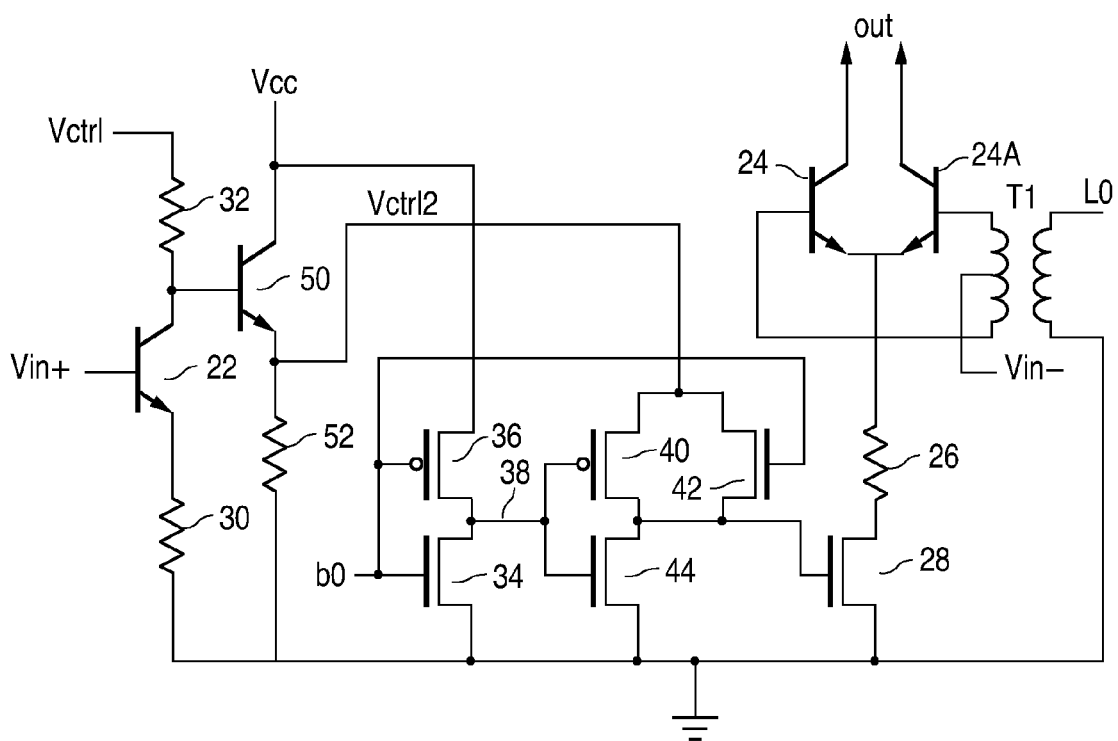
FIG. 7 illustrates the VGA having an output stage that modulates a local oscillator signal for use in an RF transmitter.

FIG. 7 illustrates the VGA of FIG. 6 but where the input signal Vin− is applied to a center tap of a transformer T1 to create a differential signal applied to the transistors 24A and 24B. A local oscillator LO signal (e.g., 500 MHz) is applied to a secondary winding of the transformer T1 to multiply the modulating signal by the LO signal. The differential signal at the output of the transistors 24A and 24B may then be applied to a power amplifier for RF transmission.

Figure 8:
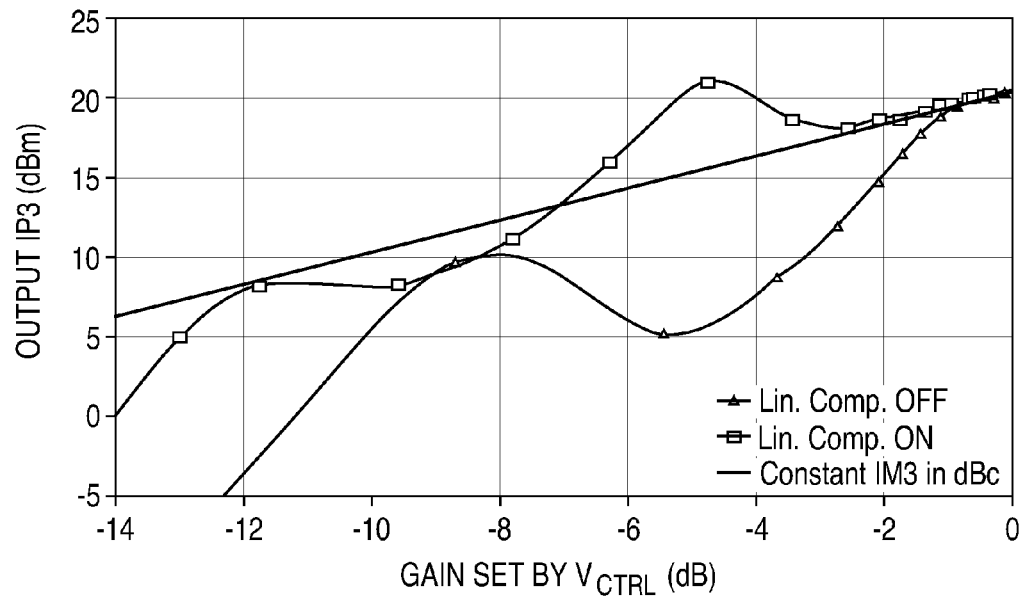
FIG. 8 are graphs of the Output Third-Order Intercept point (OIP3) vs. $V_{CTRL}$ gain, where one graph shows measurement results when the compensation transistor 22 is connected in the circuit of FIG. 7, and another graph shows measurement results when the compensation transistor 22 is disconnected from the circuit of FIG. 7.

In a test of the circuit of FIG. 7 connected in a modulator for a transmitter, two test tones, 2 MHz and 2.1 MHz, were simultaneously applied to the differential inputs of FIG. 7, expanded in a differential fashion like FIG. 5. The two signals were then up-converted to RF and converted from differential to a single-ended signal, which was measured. The $V_{CTRL}$ bias signal was ramped up during the measurement. The OIP3 vs gain was measured and plotted with the VGA fully operational (i.e., MOSFET 28 gate voltage modulated by Vin+ signal) and then with the transistor 22 disconnected (i.e., MOSFET 28 gate voltage determined only by $V_{CTRL}$). OIP3 is the output third order intercept point, based on third-order inter-modulation products (IM3), and plotting the OIP3 versus various values is a common way for designers to measure the performance of a transmitter. The simplified results are shown in the graph of FIG. 8. An ideal OIP3 value would track the solid line representing constant power difference between IM3 products and desired signal vs. gain setting. The graph shows much more linear operation with the transistor 22 connected versus when the transistor 22 is disconnected.

Figure 9:
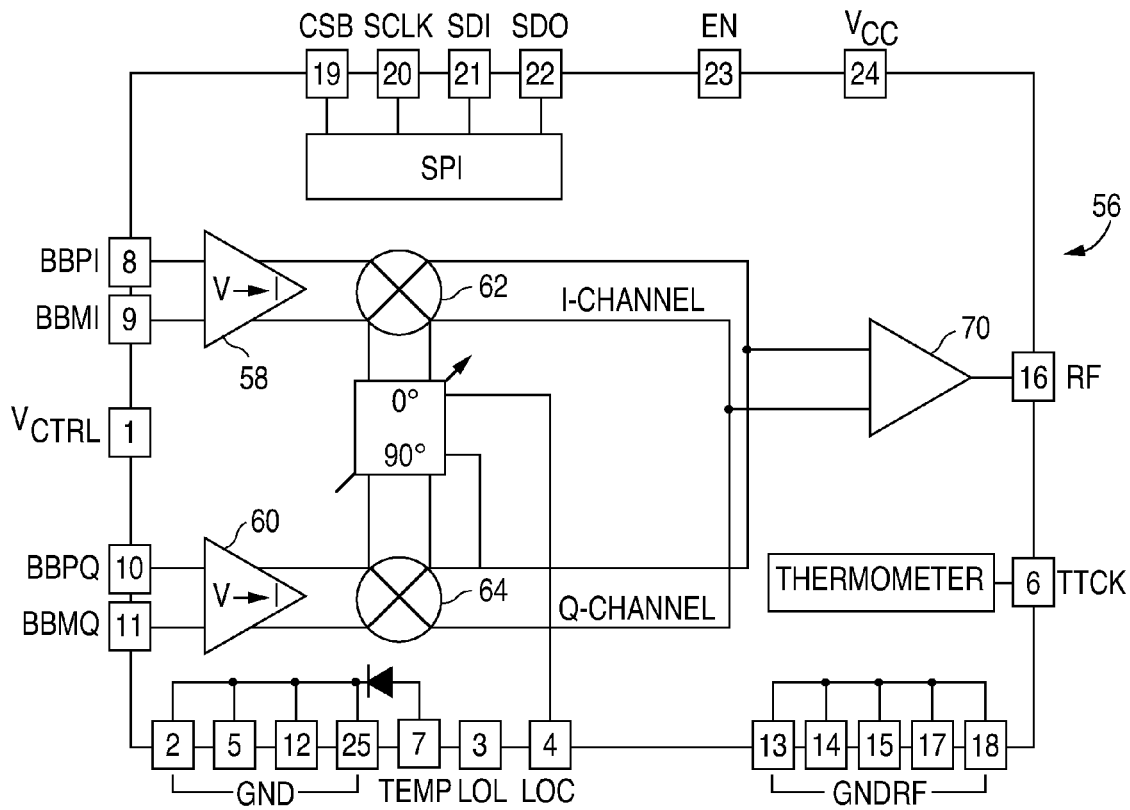
FIG. 9 illustrates an integrated circuit (IC) incorporating the amplifier of any of the embodiments, where the IC is a quadrature modulator for use in an RF transmitter.

FIG. 9 illustrates a single IC 56 that is a quadrature modulator, whose differential amplifier 58 and mixer 62, is identical to the amplifier/mixer of FIG. 7 expanded in a differential fashion like FIG. 5. This is doubled to create I and Q paths depicted as amplifiers 58, 60 and mixers 62, 64. Differential baseband signals BBPI, BBMI, BBPQ, and BBMQ are applied to the inputs of the amplifiers 58 and 60, where the positive input corresponds to the Vin+ signal and the negative input corresponds to the Vin– signal. Mixers 62 and 64 mix the amplified signals with differential LO signals (90° out of phase) to generate the I and Q signals for transmission. An RF buffer 70 converts the differential output to a single ended output for RF transmission.

Figure 10:
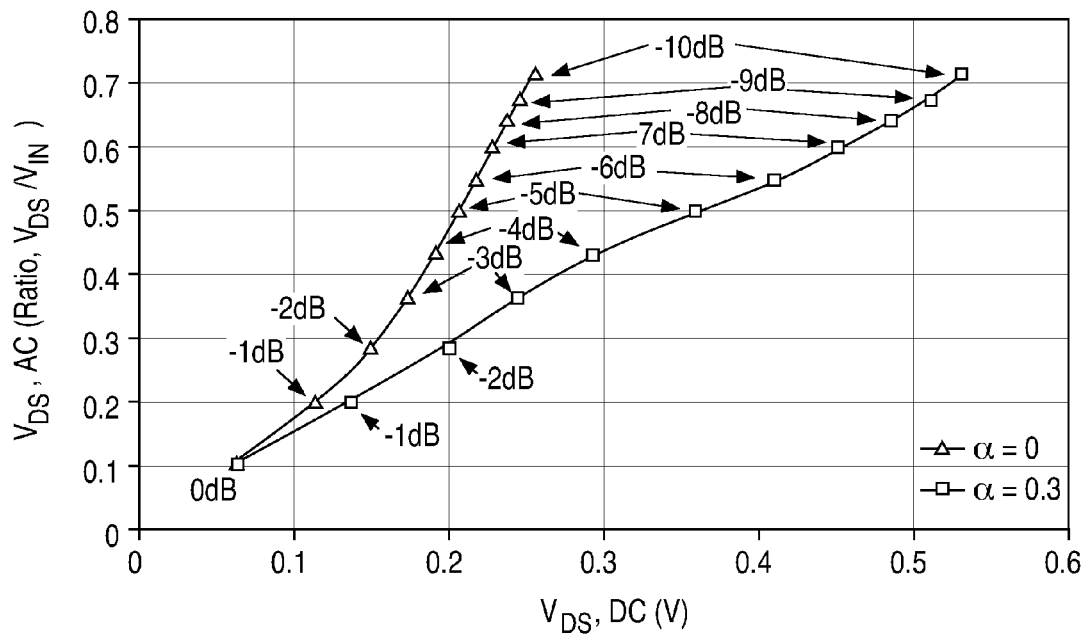
FIG. 10 illustrates the ratio of the AC voltage swing between the MOSFET 28 drain-source voltage and the input of the variable gain circuit, vs the MOSFET 28 DC drain-source voltage for α=0 and α=0.3.

FIG. 10 illustrates the MOSFET 28 drain-source AC voltage vs the drain-source DC voltage for α=0 and α=0.3. The AC Gate-Source voltage swing divided by the input signal AC voltage swing is called a. The VGA gain values from −10 dB to 0 dB in 1 dB steps are indicated in the graph (with 0 dB normalized to the maximum gain setting). When the gain is decreased from 0 dB to −10 dB, the AC voltage swing on the MOSFET 28 drain is increased significantly and is causing the dominant source of distortion. However, for α=0.3, the AC voltage swing for a certain DC drain-source voltage is lower, reducing the distortion. Also, for a corresponding AC voltage swing ($V_{DS}$, AC, which corresponds to a certain gain setting) the DC drain-source voltage ($V_{DS}$, DC) is higher, resulting in improved linearity.

$$I_D = I_{D0} + dI_D/dV_{DS} \cdot v_{DS} + \frac{1}{2} \cdot d^2I_D/dV_{DS}^2 \cdot v_{DS}^2 + \frac{1}{6} \cdot d^3I_D/dV_{DS}^3 \cdot v_{DS}^3 + \ldots \quad (3)$$

Figure 11:
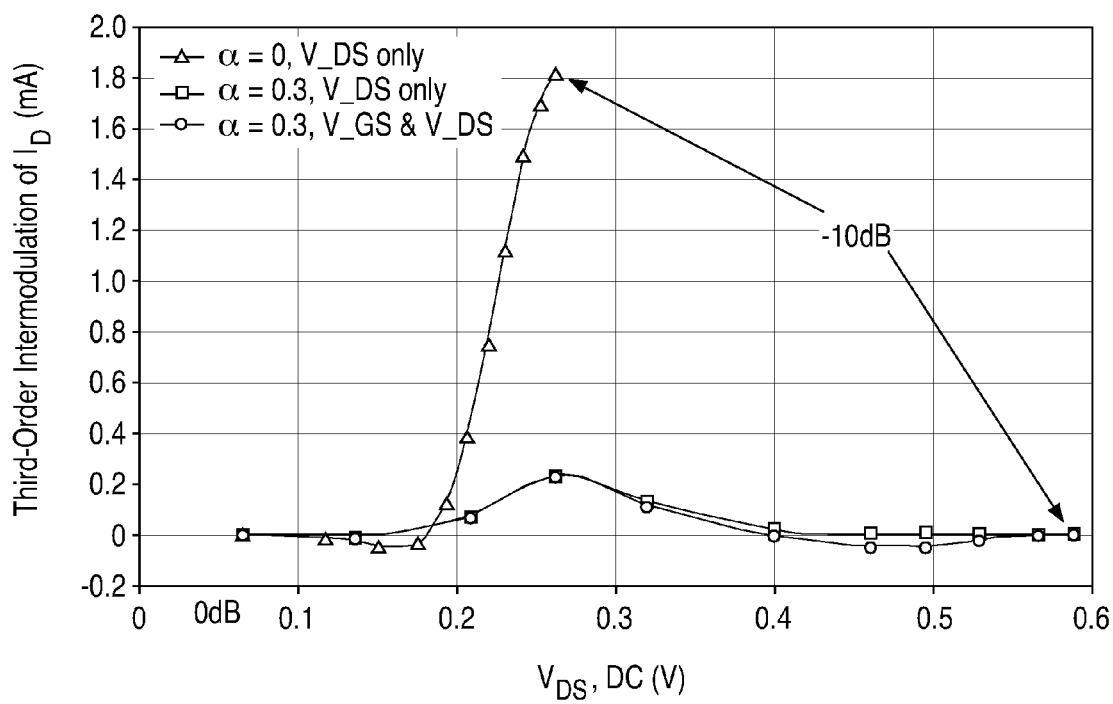
FIG. 11 illustrates the inter-modulation contribution of MOSFET 28 for α=0 and α=0.3. In the latter case, the drain-source contribution only (α=0.3, V_DS only) is drawn together with both the drain-source and the gate-source inter-modulation contribution (α=0.3, V_GS & V_DS).

FIG. 11 illustrates the third-order inter-modulation of the MOSFET 28 drain current for α=0, α=0.3 with the components from the derivatives $d^3I_D/dV_{DS}^3$ only, and α=0.3 with both derivatives $d^3I_D/dV_{DS}^3$ and $d^3I_D/dV_{GS}^3$ components included. The inter-modulation distortion is depicted for α=0 and for α=0.3. The inter-modulation distortion is derived by multiplying the third-order derivative of $I_D$ vs $V_{DS}$ (notation: $d^3I_D/dV_{DS}^3$) with the qubic voltage swing ($v_{DS}^3$). A scaling factor of (3/24) is applied to account for the scaling factor for the two-tone inter-modulation (=3/4·1/6). The scaling factor can be derived from equations 3, 4 and 5 using the Taylor expansion and goniometric formulas. As can be seen the inter-modulation is much reduced for α=0.3. By setting α=0.3 the inter-modulation distortion caused by AC signal on the gate of the MOSFET 28 starts contributing too. This is shown in the α=0.3, V_GS & V_DS graph FIG. 11. Because of opposite signs of the third-order derivatives of $d^3I_D/dV_{DS}^3$ and $d^3I_D/dV_{GS}^3$, the sum of the two can be lower than each of the components. Optimizing a can result in an overall low distortion over the full desired analog gain control range. In our case with the distortion of transistor 24 included, an overall optimum value of α=0.3 is found. In case a is chosen too high, the overall distortion will be dominated by the non-linearity caused by the MOSFET 28 gate-source voltage swing.

$$v_{DS} = \cos(w_1 t) + \cos(w_2 t) \quad (4)$$

$$I_D = \frac{3}{24} \cdot (\cos(2w_2 t - w_1 t) + \cos(2w_1 t - w_2 t)) \cdot d^3I_D/dV_{DS}^3 \cdot v_{DS}^3 + \ldots \quad (5)$$

Figure 12:
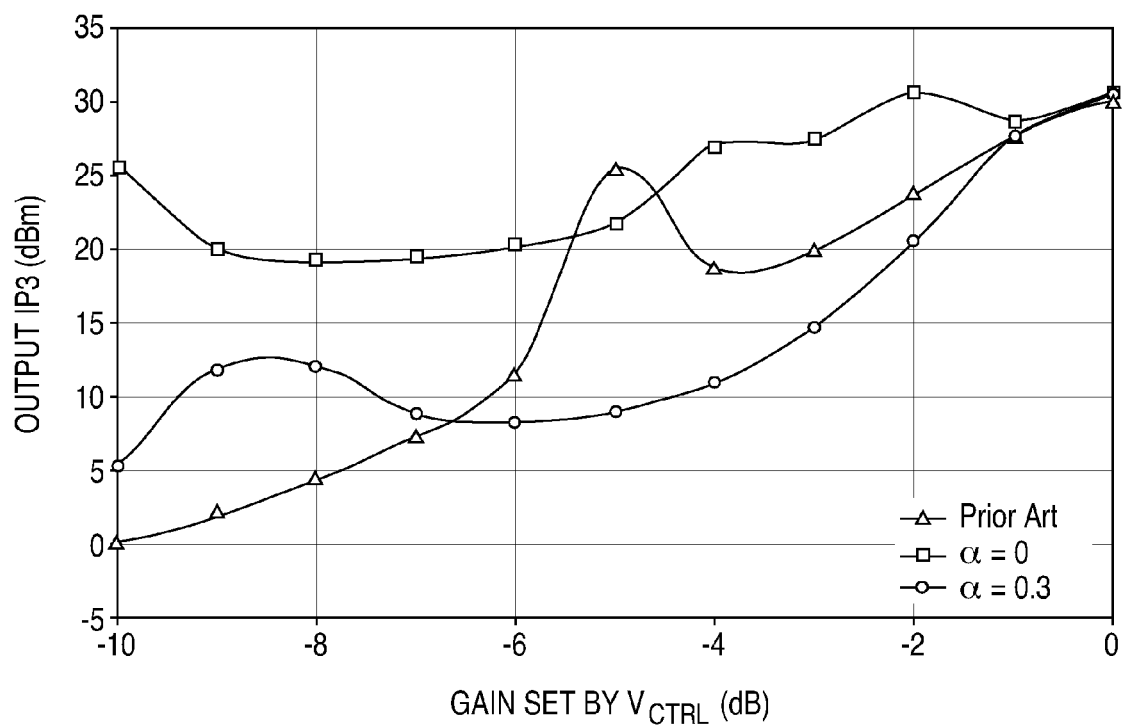
FIG. 12 illustrates a simulation of Output Third-Order Intercept Point (OIP3) vs $V_{CTRL}$ gain setting. The prior art is shown as well as the current embodiment for α=0 and α=0.3.

FIG. 12 illustrates the simulated Output Third-Order Intercept Point (OIP3) for the prior art ("Jones") and the performance of FIG. 6 expanded differentially as in FIG. 5 using α=0 and α=0.3. For a fair comparison, in the prior art, the bias currents I_DC1 and I_DC2 are chosen such that the current consumption of all three configurations is equal for the gain=0 dB point and R1 is omitted in the prior art for a comparable gain range. In these simulations, noup-conversion to RF is used. As can be seen, the overall linearity performance of the α=0.3 case is the best.

In other embodiments, the Vin+ and Vin– signals may be reversed.

Although some transistors have been shown as bipolar and MOSFETs, the transistors may be all MOSFETs. The MOSFETs shown as NMOS transistors may be switched with PMOS transistors and vice versa, and the NPN transistors can be switched with PNP transistors, also making Vcc negative while it is assumed positive in the figures.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A variable gain amplifier comprising:
   a first transistor having a control terminal, a first current handling terminal, and a second current handling terminal, the first transistor receiving at its control terminal a first input voltage for modulating a current through the first transistor, the second current terminal providing an output current of the first transistor;
   a first resistance having a first terminal coupled to the first current handling terminal of the first transistor; and
   a first MOSFET having a control terminal, a first current handling terminal and a second current handling terminal, wherein the second current handling terminal of the first MOSFET is coupled to a second terminal of the first resistance, and wherein the first current handling terminal of the first MOSFET is coupled to ground,
   the first MOSFET receiving at its control terminal a combined bias voltage and a signal proportional to the first input voltage.

2. The amplifier of claim 1 wherein the first transistor is a bipolar transistor.

3. The amplifier of claim 1 wherein the first transistor is a MOSFET.

4. The amplifier of claim 1 further comprising:
   a second transistor having a control terminal, a first current handling terminal, and a second current handling terminal, the second transistor receiving at its control terminal a second input voltage for modulating a current through the second transistor, the second input voltage being complimentary to the first input voltage;
   a second resistance having a first terminal coupled to the second current handling terminal of the second transistor; and
   a gain control voltage coupled to a second terminal of the second resistance, wherein the first terminal is coupled to the gate of the first MOSFET to supply the combined bias voltage and the signal proportional to the first input voltage.

5. The amplifier of claim 4 further comprising a controllable first disabling circuit coupled between the first terminal of the second resistance and the gate of the first MOSFET.

6. The amplifier of claim 5 further comprising a second MOSFET and a third resistance coupled in parallel with the first MOSFET and the first resistance, the second MOSFET having a control terminal receiving the combined bias voltage and the signal proportional to the first input voltage.

7. The amplifier of claim 6 further comprising a controllable second disabling circuit coupled between the first terminal of the second resistance and the gate of the second MOSFET, wherein the first disabling circuit and the second disabling circuit are independently controllable.

8. The amplifier of claim 4 further comprising a transformer coupled to the control terminal of the first transistor for modulating the first input voltage to cause the output current of the amplifier to be an RF signal.

9. The amplifier of claim 1 wherein the amplifier is part of an I or Q channel in a quadrature modulator in an RF transmitter.

10. The amplifier of claim 1 wherein the bias voltage is a DC signal and the first input voltage is an AC signal.

11. The amplifier of claim 10 wherein the first input voltage comprises a DC component.

12. A method performed by a variable gain amplifier comprising:
providing a first input voltage to a control terminal of a first transistor for modulating a current through the first transistor, the first transistor also having a first current handling terminal, and a second current handling terminal, the second current terminal providing an output current; and
providing a combined bias voltage and a signal proportional to the first input voltage to a control terminal of a first MOSFET, the first MOSFET also having a first current handling terminal and a second current handling terminal, wherein the second current handling terminal of the first MOSFET is coupled to the first current handling terminal of the first transistor via a first resistance, wherein the first current handling terminal of the first MOSFET is coupled to ground, and wherein providing the combined bias voltage and the signal proportional to the first input voltage to the control terminal of the first MOSFET modulates a conductivity of the first MOSFET to improve linearity of the amplifier.

13. The method of claim 12 wherein the first transistor is a bipolar transistor.

14. The method of claim 12 wherein the first transistor is a MOSFET.

15. The method of claim 12 further comprising:
providing a second input voltage to a control terminal of a second transistor for modulating a current through the second transistor, the second input voltage being complimentary to the first input voltage, the second transistor also having a first current handling terminal and a second current handling terminal,
wherein a second resistance has a first terminal coupled to the second current handling terminal of the second transistor; and
providing a gain control voltage to a second terminal of the second resistance, wherein the first terminal is coupled to the gate of the first MOSFET to provide the combined bias voltage and the signal proportional to the first input voltage.

16. The method of claim 12 wherein the bias voltage is a DC signal and the first input voltage is an AC signal.

17. The method of claim 16 wherein the first input voltage comprises a DC component.

* * * * *